US009603281B2

(12) United States Patent
Crosby, Jr.

(10) Patent No.: US 9,603,281 B2
(45) Date of Patent: *Mar. 21, 2017

(54) TRULY MODULAR BUILDING DATACENTER FACILITY

(71) Applicant: Compass Datacenters, LLC, Dallas, TX (US)

(72) Inventor: Christopher J. Crosby, Jr., Dallas, TX (US)

(73) Assignee: Compass Datacenters, LLC, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/463,474

(22) Filed: Aug. 19, 2014

(65) Prior Publication Data

US 2014/0352231 A1 Dec. 4, 2014

Related U.S. Application Data

(63) Continuation-in-part of application No. 13/792,948, filed on Mar. 11, 2013, now Pat. No. 8,839,569.
(Continued)

(51) Int. Cl.
*E04H 1/00* (2006.01)
*H05K 7/14* (2006.01)
*E04H 5/00* (2006.01)

(52) U.S. Cl.
CPC ..... *H05K 7/1497* (2013.01); *E04H 2005/005* (2013.01)

(58) Field of Classification Search
CPC .................. H05K 7/1497; E04H 2005/005
See application file for complete search history.

(56) References Cited

U.S. PATENT DOCUMENTS 3,882,649 A * 5/1975 Mah .................. E04B 1/20
                                                       52/236.5
3,924,370 A 12/1975 Cauceglia et al.
(Continued)

FOREIGN PATENT DOCUMENTS

GB      2467808 A      8/2010
WO   WO 2010/138771 A1   12/2010

OTHER PUBLICATIONS

"HP Performance Optimized Datacenter" downloaded Feb. 26, 2013 from http://en.wikipedia.org/wiski/HP_Performance_Optimized_Datacenter&oldid=536557730, 4 pages.
(Continued)

*Primary Examiner* — Jeanette E Chapman
(74) *Attorney, Agent, or Firm* — Rutan & Tucker, LLP

(57) ABSTRACT

A modular datacenter facility is constructed with a set of building modules of different types of functionality to form an entire datacenter facility having a standardized pre-approved architectural design and layout. All instances of a particular type of building module will have approximately a same floor plan and architectural design. An initial set of building modules can be built upon a parcel of land, and then as needs of space and additional capacity of the modular datacenter facility increase, then at a future point in time additional building modules of the different types can be rapidly added to the initial set of building modules. The building modules of the different types use one or more connecting corridors architected into at least a first type of building module and corresponding aligned doorways between both building modules to interconnect two building modules adjacent and abutted to each other.

21 Claims, 9 Drawing Sheets

Related U.S. Application Data

(60) Provisional application No. 61/609,812, filed on Mar. 12, 2012.

(56) References Cited

U.S. PATENT DOCUMENTS

| | | | |
|---|---|---|---|
| 5,477,649 | A | 12/1995 | Bessert |
| 6,019,322 | A | 2/2000 | Shimizu |
| 6,651,393 | B2 | 11/2003 | Don et al. |
| 7,278,273 | B1 | 10/2007 | Whitted et al. |
| 7,724,513 | B2 | 5/2010 | Coglitore et al. |
| 7,738,251 | B2 | 6/2010 | Clidaras et al. |
| 7,971,446 | B2 | 7/2011 | Clidaras et al. |
| 8,218,322 | B2 | 7/2012 | Clidaras et al. |
| 8,514,572 | B2 | 8/2013 | Rogers |
| 8,839,569 | B2 | 9/2014 | Crosby, Jr. |
| 2006/0087122 | A1 | 4/2006 | Sheffield |
| 2007/0144079 | A1 | 6/2007 | Hourihan |
| 2009/0058098 | A1 | 3/2009 | Flynn |
| 2009/0159241 | A1* | 6/2009 | Lipp .............. F28D 1/05316 165/80.2 |
| 2009/0229194 | A1 | 9/2009 | Armillas |
| 2010/0235206 | A1* | 9/2010 | Miller .............. G06Q 10/063 705/7.11 |
| 2010/0302744 | A1 | 12/2010 | Englert et al. |
| 2011/0023388 | A1 | 2/2011 | Tong et al. |
| 2011/0083824 | A1 | 4/2011 | Rogers |
| 2011/0146164 | A1* | 6/2011 | Haney .............. E04H 5/02 52/79.1 |
| 2012/0255710 | A1 | 10/2012 | Maselli et al. |
| 2013/0293017 | A1 | 11/2013 | Englert et al. |

OTHER PUBLICATIONS

"Sun Modular Datacenter", 4 pages. Copyright 2004-2009 Sun Microsystems, Inc.

"Hardening of Buildings and Structures", 2 pages, Hardened Structures Blast and Structural Engineering Team, Hardened Structures, Hardened Shelters, LLC downloaded Apr. 28, 2014 from http://www.hardenedstructures.com/hardening-of-buildings.php.

Examiner's Report mailed Aug. 26, 2015 for Canadian Patent Application No. 2,808,914, 5 pages. Canadian Intellectual Property Office, Gatineau, QC, Canada.

* cited by examiner

Each wall section forming the hardened shell interconnects with adjacent wall sections, for example, in a tongue and groove mechanism.

TRULY MODULAR BUILDING DATACENTER FACILITY

RELATED APPLICATIONS

Pursuant to 35 U.S.C. §120, this application is a Continuation-in-Part of U.S. Non-Provisional application Ser. No. 13/792,948, filed Mar. 11, 2013, entitled "A Truly Modular Building Datacenter Facility, now U.S. Pat. No. 8,839,569, which claims the benefit under 35 U.S.C. §119(e) of U.S. Provisional Patent Application Ser. No. 61/609812, filed Mar. 12, 2012, entitled "A Truly Modular Building Datacenter Facility," both of which are incorporated herein by reference.

NOTICE OF COPYRIGHT

A portion of the disclosure of this patent document contains material that is subject to copyright protection. The copyright owner has no objection to the facsimile reproduction by anyone of the interconnect as it appears in the Patent and Trademark Office Patent file or records, but otherwise reserves all copyright rights whatsoever.

BACKGROUND

In general, an embodiment relates to building a datacenter facility. Information Technology operations are a crucial aspect of most organizational operations in the western world. One of the main concerns is business continuity. Companies rely on their information systems to run their operations. If a system becomes unavailable, company operations may be impaired or stopped completely. It is necessary to provide a reliable infrastructure for IT operations, in order to minimize any chance of disruption. Information security is also a concern, and for this reason a data center has to offer a secure environment, which minimizes the chances of a security breach. A data center must therefore keep high standards for assuring the integrity and functionality of its hosted computer environment. Telcordia GR-3160, NEBS Requirements for Telecommunications Data Center Equipment and Spaces, provides guidelines for data center spaces within telecommunications networks, and environmental requirements for the equipment intended for installation in those spaces.

Most conventional thinking is that the only way to build a datacenter facility on a cost-effective basis is to do so at scale. The common thesis is that the only way to get amount of dollars need per square foot low enough is to have scale-buying power (building 100,000 square feet and up). Additionally, from a modular perspective, the current industry thought process is to build the data hall as well as the mechanical/electrical plant on a shipping containerized basis.

SUMMARY

Various methods and apparatuses are described for a modular datacenter facility constructed with a set of building modules of different types of functionality to form/make up an entire datacenter facility having a standardized pre-approved architectural design and layout. Each type of building module in the set has a specific collection of functionality associated with that type of building module. Each building module of the different types is a pre-engineered, standardized building block containing architectural features to allow easy configuration and integration with the other building modules that form the modular datacenter facility. All instances of a particular building module with that type of functionality will have approximately a same floor plan and architectural design. The modular datacenter facility houses computing systems. The computing systems includes servers and storage devices housed in hot and cool zones, routers and switches that transport data traffic between the servers as well as transport traffic to a world exterior to the modular data center facility. An initial set of building modules can be built upon a parcel of land, and then as the number of customers needing a datacenter functionality increase or the needs of current customer's space and additional capacity of the modular datacenter facility increases, then at a later/future point in time additional building modules of the different types can be rapidly adjoined/added to the initial set of building modules; and thus, a data center facility transformation takes a step-by-step approach carried out over time through an addition of more building modules added to existing building modules. This rapid addition of building modules to the existing modules allows for a truly modular built data center. The building modules of the different types use one or more connecting corridors architected into at least a first type of building module and corresponding aligned doorways between both building modules to interconnect two building modules adjacent and abutted to each other.

BRIEF DESCRIPTION OF THE DRAWINGS

The multiple drawings refer to the example embodiments of the invention.

FIG. 4 illustrates a block diagram of an embodiment of a physical composition and geographic arrangement of building modules matched to a current capacity and space needs of a user of the modular datacenter facility as well as to a geography of the parcel of land that the modular data center facility will be located on.

Figure 1:
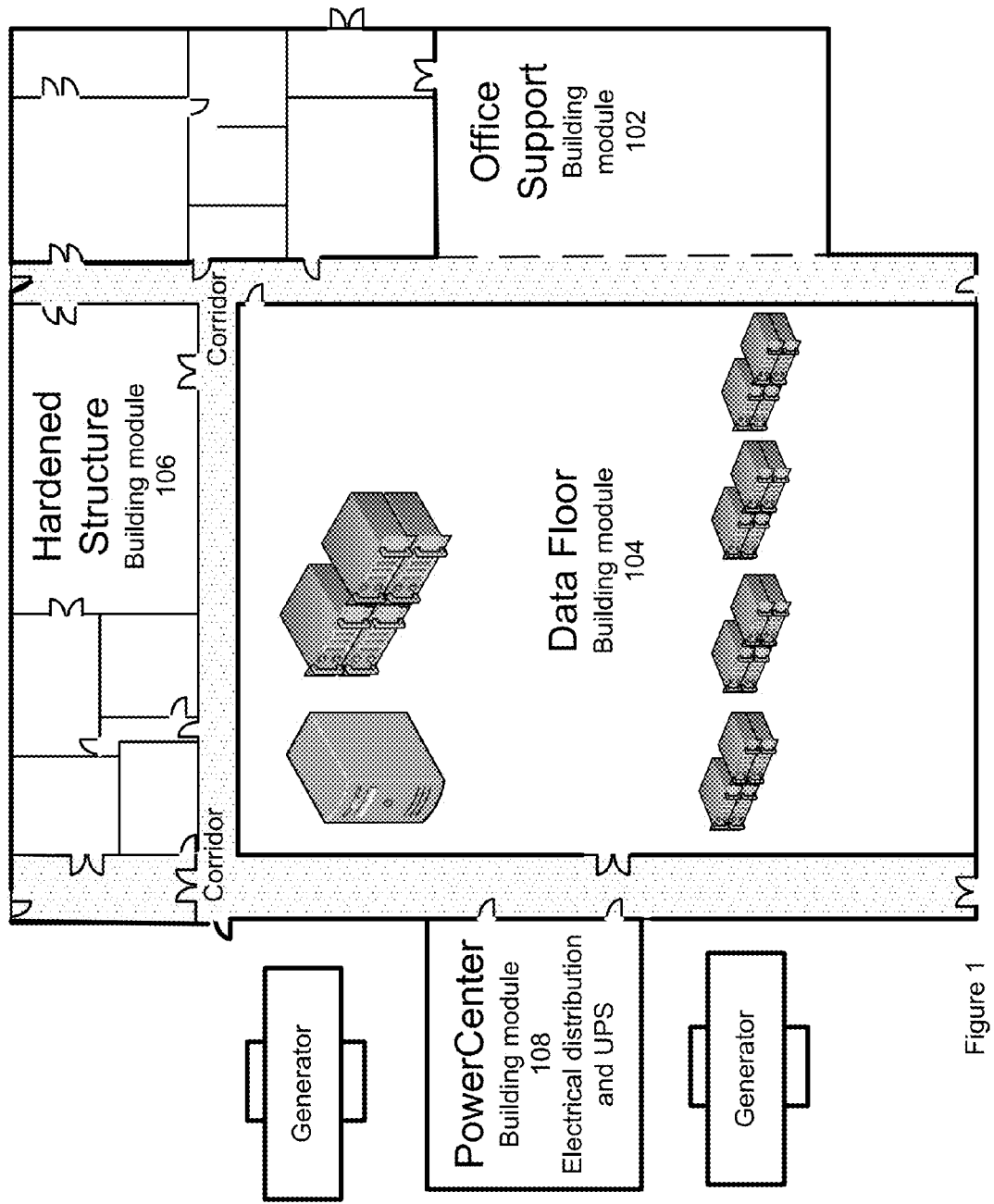
FIG. 1 illustrates a block diagram of an embodiment of an initial modular datacenter facility constructed with a set of building modules of different types of functionality to form an entire datacenter facility having a standardized pre-approved architectural design and layout.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific heights and dimensions, named components, connections, types of offices, etc., in order to provide a thorough understanding of the present invention. It will be apparent, however, to one skilled in the art that the present invention may be practiced without these specific details. In other instances, well known components or methods have not been described in detail but rather in a block diagram in order to avoid unnecessarily obscuring the present invention. Thus, the specific details set forth are merely exemplary. The specific details may be varied from and still be contemplated to be within the spirit and scope of the present invention. Example processes for and apparatuses to provide a truly modular building datacenter facility are described. The following drawings and text describe various example implementations of the design.

A modular datacenter facility may be constructed with a set of building modules of different types of functionality to form an entire datacenter facility having a standardized pre-approved architectural design and layout. All instances of a particular type of building module will have approximately a same floor plan and architectural design. An initial set of building modules can be built upon a parcel of land, and then as needs of space and additional capacity of the modular datacenter facility increase, then at a future point in time additional building modules of the different types can be rapidly added to the initial set of building modules. The building modules of the different types use one or more connecting corridors architected into at least a first type of building module and corresponding aligned doorways between both building modules to interconnect two building modules adjacent and abutted to each other.

FIG. 1 illustrates a block diagram of an embodiment of an initial modular datacenter facility constructed with a set of building modules of different types of functionality to form an entire datacenter facility having a standardized pre-approved architectural design and layout.

The modular datacenter facility is constructed with a set of building modules of different types of functionality to form/make up an entire datacenter facility having a standardized pre-approved architectural design and layout. Each type of building module in the set has a specific collection of functionality associated with that type of building module. Each type of building module, such as a hardened-structure building module 106, a data-floor building module 104, a power-center building module 108, and an office-support building module 102, has a specific set of functionality associated with that building module. Each building module of the different types is a pre-engineered, standardized building block containing architectural features to allow easy configuration and integration with the other building modules that form the modular datacenter facility. All instances of a particular building module with that type of functionality will have approximately a same floor plan and architectural design. Small changes can be made to the interior of a given building modules design but in general, the floor plan and architectural design remain the same. Components making up each of the building modules 102-108 are prefabricated and shipped to the parcel of land.

The modular datacenter facility houses computing systems in a data-floor building module 104. The computing systems includes servers and storage devices housed in hot and cool zones, routers and switches that transport data traffic between the servers as well as transport traffic to a world exterior to the modular data center facility. The modular datacenter facility also includes redundant or backup power supplies, redundant data communications connections, environmental cooling controls, and security devices. An initial set of building modules can be built upon a parcel of land, and then as the number of customers needing a datacenter functionality increase or the needs of current customer's space and additional capacity of the modular datacenter facility increases, then at a later/future point in time additional building modules of the different types can be rapidly adjoined/added to the initial set of building modules; and thus, a data center facility transformation takes a step-by-step approach carried out over time through an addition of more building modules added to existing building modules. This rapid addition of building modules to the existing modules allows for a truly modular built data center. The building modules of the different types 102-108 use one or more connecting corridors architected into at least a first type of building module and corresponding aligned doorways between both building modules to interconnect two building modules adjacent and abutted to each other.

Initially all four types of building modules 102-108 will be built onto a given geographic plot of land. At a later/future point in time, expansion can occur and building module types can be added to support a new customer on the same existing parcel of land or expand for a current customer. In general, the new expansion can then choose to try to share one or more of the previously fabricated and installed building module types 102-108 or build its own instance of that building module type. The minimum land requirement depends on the set back required by the customer. The Truly modular datacenter design has an optional office-support building module 102 for future builds that is required on the first datacenter constructed, but not on the future adjacent datacenters. The initial datacenter built in a parcel of land will include the set of four building modules of different types of functionality: the data-floor building module 104; the hardened-structure building module 106; the office-support building module 102; and the power center building module 108.

The data-floor building module 104 is the principal module of the datacenter as it provides the hardened environment for the computing systems that includes the server room. The data-floor building module 104 is approximately 10,000 square feet and works in unison with the power-center building module 108 to provide one MW of UPS power at a 2N redundancy. This power center building module 108 is pre-fabricated off site and it includes everything in the design electrical system. Each power-center building module 108 includes Switchgear, an Uninterruptable Power Supply, Power Controls, is associated with a data-floor building module 104. The data-floor building module 104 structure also supports the N+1 mechanical system that features airside economization and delivers high-efficiency cooling via 2 air chases a long the walls of the data-floor building module, the main datacenter, and a 36-inch raised floor system.

The hardened-structure building module 106 houses the building integrity structure of the truly modular datacenter. The hardened-structure building module 106 includes the hardened shell of the building, a dedicated customer storage and staging space, primary Telco room, personnel corridor, service corridor, Primary POP Room, various office space, site storage, fire riser, etc. The connecting corridors in the form of one or more personnel or service corridors are laid out between an interior wall of the hardened-structure building module 106 and an exterior wall forming the hardened shell of the hardened-structure building module 106. Each wall section forming the hardened shell of the building module has reinforced framework to meet Miami-Dade County standards to withstand up to 150 mph winds and a 1.5 seismic importance factor. The wall sections forming the hardened shell are connected to a foundation/hardened environment.

The office-support building module 102 includes a security office, loading dock, break room, dedicated office space, lobby, janitorial, restrooms, among other support spaces and amenities that support any datacenter use. The office-support building module 102 type is the most commonly shared building module type between different customers.

These four building modules make up the Truly modular datacenter facility and it is approximately 20,680 square feet. The Truly Modular Datacenter consists of the above four (4) modules connected together, working in unison. This module synergy provides a unique facility layout that results in a highly efficient datacenter.

Note: The office-support building module 102 is the optional module for future builds. In this case, the customer has the option to build a second office-support building module 102 blocks or share the first office-support building module 102 blocks that was built 'Day 1'. Each building module type is designed to easily connect to and integrate with another building module. Modularity is achieved by connecting the connecting corridors (i.e. service corridor and the personnel corridor) between the adjacent building modules making up the datacenter facility. Each building module type in the set of building modules of different types of functionality is architected and formed as a totally separated building that is interconnected to another building module via the connecting corridor that 1) wraps around a data floor containing the servers and storage devices housed in hot and cool zones in a data-floor building module 104 and 2) interconnects to a power center building module and an office-support building module 102 via the aligned doors between these building modules.

The truly modular building datacenter facility melds all the benefits of modularity with the reality of a true, hardened datacenter. Each building module 102-108 has the components making up that module shipped to the site as a pre-fabricated unit that is assembled on site using standard construction techniques. Each building module is composed of standardized units and sections for easy construction on site at the parcel of land using the standard construction techniques. The modular datacenter facility is hardened in its architecture and component selection in the pre-fabricated components to withstand adverse conditions like high winds, heavy snow, and seismic activity.

The truly modular building datacenter facility allows customers to manage the growth of their business in well-defined steps without paying for unused space or capacity. When coupled with the ability of the truly modular building datacenter facility to fully dedicate or share common areas at the client's election, the solution provides capabilities and flexibility that no other product offering has.

Figure 2A:
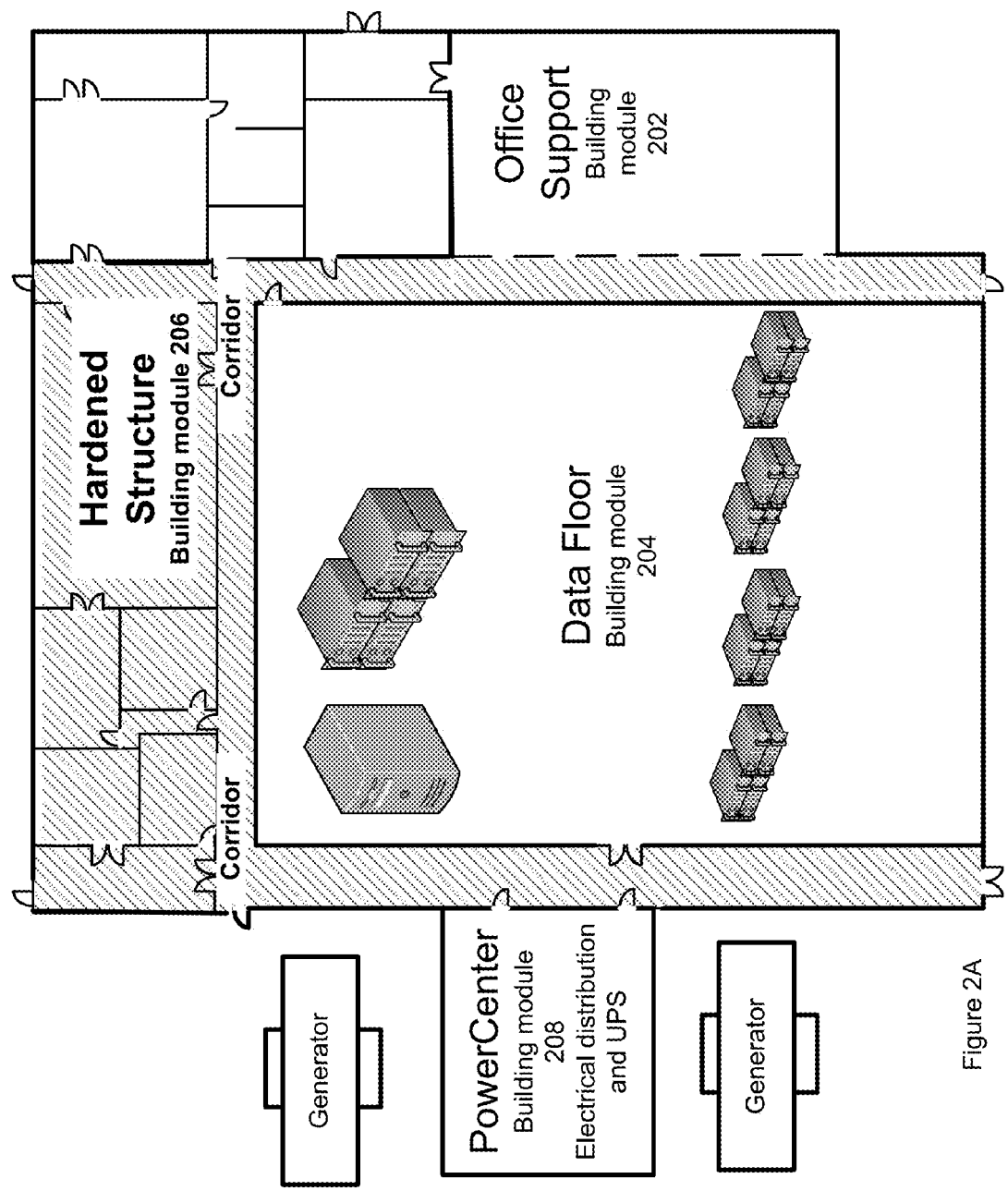
FIG. 2A illustrates a block diagram of an embodiment of the connecting corridor in the hardened-structure building module wrapping around a data floor containing the servers and storage devices housed in hot and cool zones in the data-floor building module.

FIG. 2A illustrates a block diagram of an embodiment of the connecting corridor in the hardened-structure building module wrapping around a data floor containing the servers and storage devices housed in hot and cool zones in the data-floor building module.

The data-floor building module 204 is the heart of the datacenter environment.

This set of building modules of different types of functionality includes the data-floor building module 204 that contains the computing systems. The data-floor building module 204 supports racks of servers having densities varying in power consumption from 2kW to 20kW without containment walls between the racks of servers of varying power consumption density. The data-floor building module 204 has a multitude of 80' steel joists horizontally connecting parallel sections of wall of the building module to eliminate a need for support columns being located on the 10,000 square feet of raised 36-inch floor that supports the computing systems. The joists creating an open floor space ensures that users of the data-floor building module 204 will have a maximum degree of flexibility to accommodate a variety of potential server rack configurations in the hot and cold zones of the data-floor building module 204. The raised 36-inch floor houses the computing systems as well as creates a dual plenum for air supply with cooling supply air being supplied underneath the raised floor as well as a ceiling plenum for hot air return.

The data-floor building module 204 has segmented walls interlocked with an adjacent wall segment and that are also horizontally connected by joists to eliminate any need for support columns in the raised 36-inch floor that supports the computing system. The raised floor exceeds 2500 square feet, which is a larger area to store computing equipment upon than any container in a standard shipping container, and typically can be 8000 to 12,000 square feet. The wall sections and sections of raised floor are prefabricated and shipped to the site.

The data-floor building module 204 raised floor system may be a Tate bolted stringer "Concore" 1500. The raised floor may be basket weave stringer, cement paste to anchor support system with being electrically grounded and with lighting protection. The floor system load ratings may be, for example, Concentrated Load—1,500 lbs; Standard Load—1,250 lbs; Uniform Load—375 lbs; and Ramp Load—2,000 lbs. The data room may include a false ceiling twelve feet from raised floor to create a hot air return plenum.

The data-floor building module 204 containing the computing systems also has a cooling system on its roof that features airside economization and delivers high-efficiency cooling via two or more air chases along the walls of a data floor room containing to the computing system housed upon a raised data floor. The roof provided is the highest quality, lightweight-insulating concrete with a white PVC membrane fully adhered to support the weight of the air handlers, snow, and other heavy weighted objects.

In an example embodiment, the data-floor building module 204 uses packaged air handlers to control the air temperature and moisture of the data floor environment. The modular datacenter's mechanical infrastructure comprises four 120 Ton Trane Intellipak units with outside air economization capabilities in a N+1 configuration. These roof top units have variable frequency drives that increase the efficiency of the unit in the entire load spectrum. These packaged air handlers are installed in the roof and they support full outside air economization. Additionally, the power-center building module 208 is supported by two (2) 15 Ton Trane packaged air handlers.

A redundancy breakdown by components is outlined in the following table:

| Component | Redundancy |
| --- | --- |
| PDU | 2N (A + B) |
| UPS | 2N (A + B), 5 minute battery system per side at full load |
| Mechanical | N + 1, normal operating mode is all units at part load |
| Switchgear | 2N (A + B) in main-tie-main configuration with dual PLC |
| Generator | N with option for N + 1 "swing" generator that can support multiple data-floor building modules |
| Utility | N (spare transformer reserved at utility company) |

The data-floor building module 204 has dedicated customer storage space for each customer built into that building module. The data floor space is free of support columns, and has a dual plenum data hall environment. The data-floor building module 204 structure also supports the N+1 mechanical system that features airside economization and delivers high-efficiency cooling via 2 air chases a long the walls of the data-floor building module 204, houses the main datacenter raised 36-inch floor to store the computing equipment upon.

Next, the set of buildings are connected via the connecting corridors formed between an interior wall closest to an exterior wall forming a shell of that building module. The connecting corridor has two or more doors, with one or more doors located at at least both ends of the connecting corridor and the aligned doors swing open in an opposite direction to the building module that they are connecting to in order to facilitate future expansions and interconnections with adjacent and abutted building modules.

Next, the set of building modules includes a hardened-structure building module 206. The hardened-structure building module 206 is the shell component of the truly modular datacenter. The hardened-structure building module 206 comprises of the building integrity, rooms and the corridors that act as the connection point with additional building modules. The layout/floor plan of the building modules allows the corridors around the outer layer of the hardened structure to interconnect with other building module types. The components for the hardened-structure building module 206 may include the wall sections of the hardened shell, an engineer office, a primary Telco room, a sprinkler fire riser, a house electrical room, a house mechanical room, a dedicated storage and staging room, and the connecting corridors. (See also FIG. 2B)

The hardened shell, formed by wall sections shipped to the site, is placed to form a footprint of, for example, approximately 270 feet wide by 340 feet deep. The wall sections connect to a foundation. The foundation may be, for example, 36-inches concrete piers, to 20 feet at data-floor building module 204 columns, and 24-inches concrete piers at the hardened-structure building module's 206 service corridor and support corridors, and 24 inches concrete piers at the other building modules. The slab of the building modules may be a 6-inch slab for the data-floor building module 204, and 4-inch slab at the other building modules 202, 206, 208.

The wall sections of the hardened shell include a steel moment connected frame structure with columns and beams. The wall sections are connected with steel joists. These areas are hardened withstand up to Miami-Dade 149 mph.

Figure 8A:
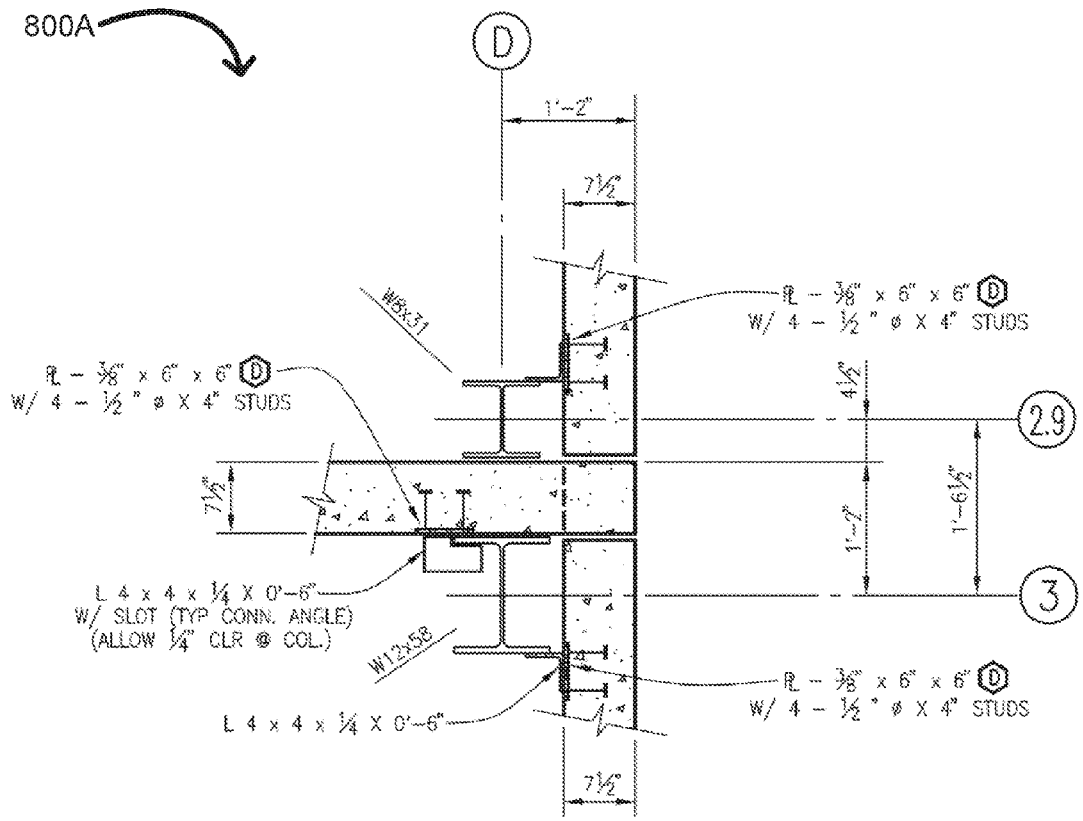
FIG. 8A illustrates a diagram of an embodiment of a modular datacenter facility or a portion thereof 800A.
Figure 8B:
FIG. 8B illustrates a diagram of an embodiment of a modular datacenter facility or a portion thereof 800B.

In an example, each of the wall sections forming the hardened shell of the building module have cast-in weld plates for a shelf angle to receive joists to support a weight of a roof and the walls of the hardened shell and then transfer that weight through framework built into the sectioned walls onto the foundation of the building. Each of the wall sections forming the hardened shell is at least ten inches thick, typically twelve inches. Each wall section forming the hardened shell interconnects with adjacent wall sections, for example, in a tongue and groove mechanism as shown in FIGS. 8A and 8B. Each wall section forming the shell is prefabricated and shipped to the parcel of land to be installed as part of the hardened-structure building module 206.

The exterior walls at the hardened-structure building module 206 and all of the corridor walls may be, for example, tilt-up panel sections of wall 19' tall, 5 to 12 inches thick along the column line, which provide for at least 3-hour fire separation (IBC Firewall). The hardened-structure building module 206 is shipped in sections that include: an Engineering Office with four hundred squared feet office space on a 36-inch raised floor; a dedicated Storage Room with twenty four hundred squared feet shell space on slab; and a room that houses the fire riser components with Fire Suppression and Detection.

The hardened-structure building module 206 is the hardened shell building of this modular approach. The component selection and architectural design of the building is hardened to Miami-Dade County standards (150 mph). The roof provided is the highest quality, lightweight-insulating concrete with a white PVC membrane fully adhered. There are no drains in the roof structure as slope with exterior scuppers and downspouts provide all removal of water.

The customer storage room of the hardened-structure building module 206 has ample space for storage and staging prior to moving the equipment to the data hall. Additionally the connecting corridors for future pods have optional doors at each end to facilitate future expansions. Also, the primary POP room provides generator backed power and cooling for telecom.

Figure 3:
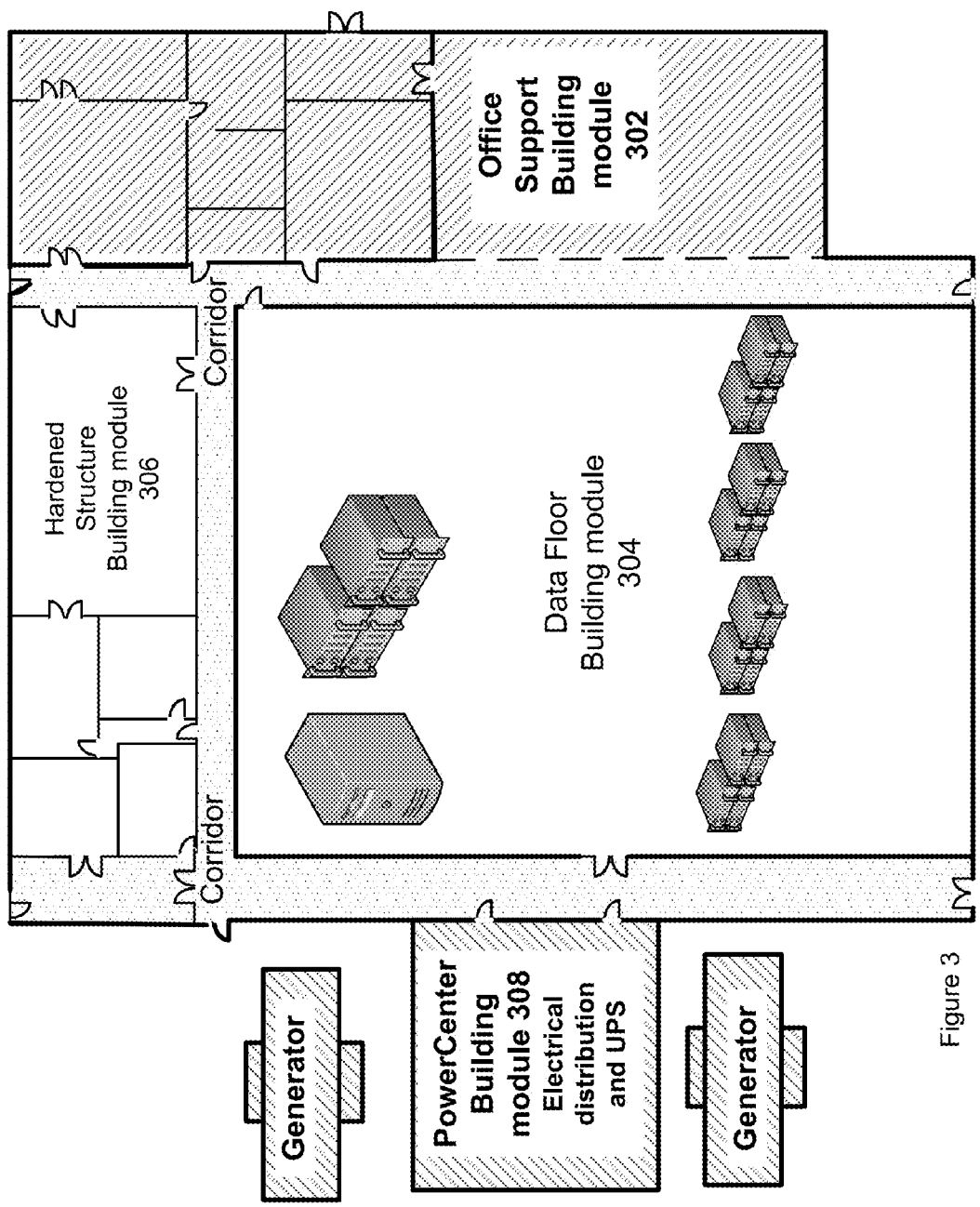
FIG. 3 illustrates a block diagram of an embodiment of the power-center building module and the office-support building module having the aligned doors fabricated into the building module in order to interconnect with the connecting corridor.

FIG. 3 illustrates a block diagram of an embodiment of the power-center building module and the office-support building module having the aligned doors fabricated into the building module in order to interconnect with the connecting corridor. The set of building modules of different types of functionality includes a power-center building module 308. The power-center building module 308 is the heart of the datacenter power delivery mechanism for the building modules. The power-center building module 308 is pre-fabricated off site and it includes a modular pre-fabricated MEP room that houses the switchgear, an Uninterruptable Power Supply, power controls, electrical power generators, and transformers, etc. The power-center building module 308 also provides the generator-backed power for the POP rooms and the House power. The power center building module has a hardened steel shell structure and one or more aligned doors fabricated into the building module in order to interconnect with the connecting corridor, which forms an outer layer of another building module that is adjacent and abutted to the power center building module. The power center building module 308 includes one to two generators. The generators may be a two Megawatt diesel generator in an N configuration to provide back-up power in case of utility power failure, with the second generator as a swing generator. Each generator is housed in a weatherproof enclosure. The customer has the option to install or not the additional generator to serve as a swing generator supplying backup electrical power to multiple data-floor building modules 304. (See FIG. 4) The power center building module 308 includes Power Distribution Units (PDU's). The data-floor building module 304 will have eight PDU's that will serve as the electrical distribution point for the customer. The PDU's are prefabricated and shipped to the site.

A 2500kVA outdoor transformer from the Utility Power Grid exists for each 1000kW, Truly-Modular Data Center. The 2500kVA transformer will provide power for each one of the building modules through dual (A/B) 3000A switchboards controlled by a 5-breaker PLC in the power center building module. The sequence of electrical power supply operation of the system is controlled automatically through deployment of a PLC control unit installed in the 3000A main switchboard. The optional swing generator will be a third source of power available to each truly modular data center. Should the standby generator fail to come online after loss of the utility source, the optional swing generator will pick up the critical loads of the system.

Next, the set of building modules of different types of functionality includes an office-support building module 302. The building module is partitioned into multiple rooms. The exterior doors aligned to the hardened-structure building module 306 are insulated HM in hollow metal frames that swing open. Interior doors for the office-support building module 302 can be solid core wood doors in frames in office areas. The primary Telco Room has access points to the four inch conduits run from outside of the facility to the Telco Room and other rooms in the building module and multiple 4 inch conduits run from Telco Room to data-floor building module 304.

Figure 2B:
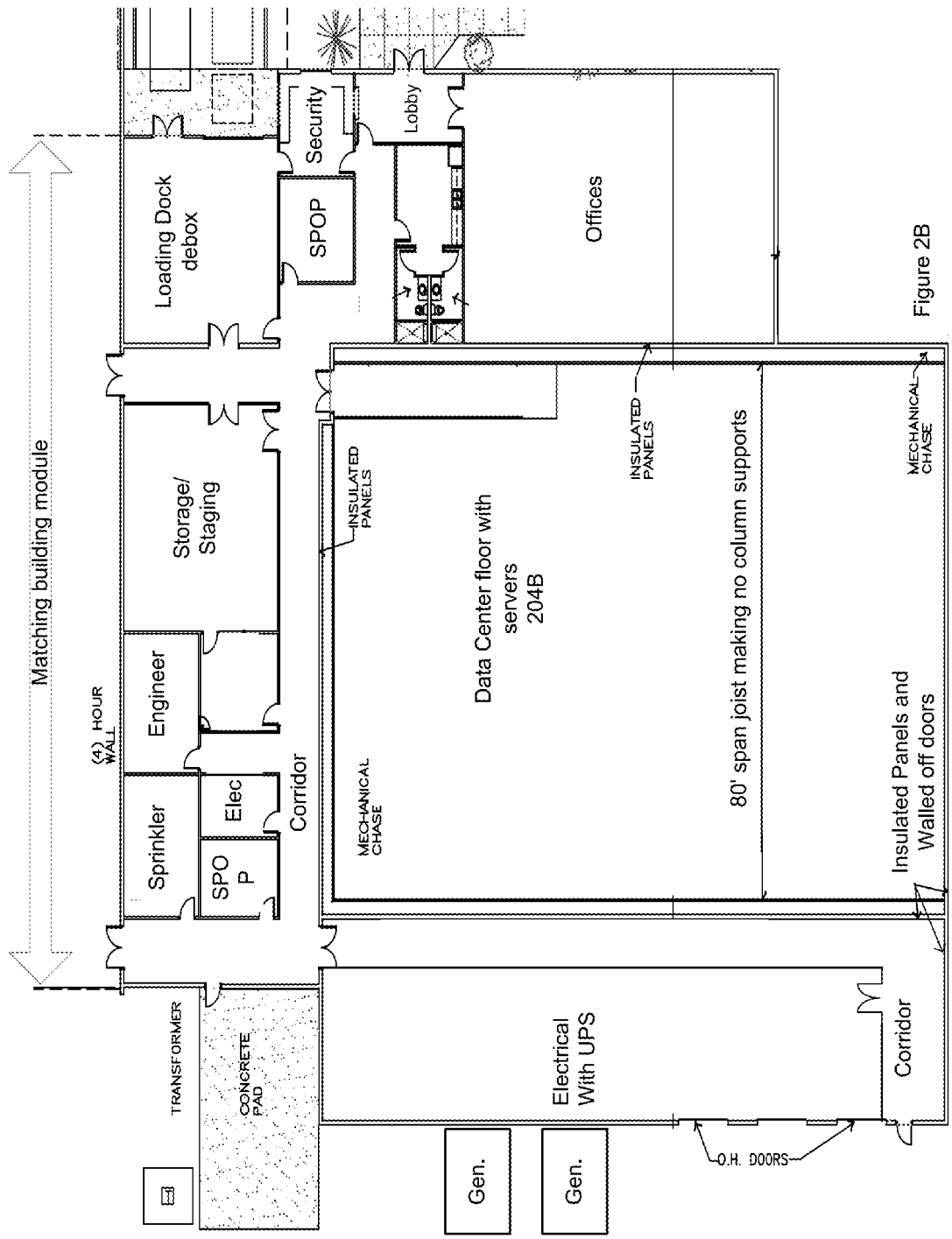
FIG. 2B illustrates a block diagram of an embodiment of the office-support building module with a fishbowl security center that looks over the both the lobby man-trap area and the loading dock, and a hardened-structure building module that has a dedicated customer storage and staging space as well as connecting corridors.

The office-support building module 302 that comes in prefabricated segments, which include a lobby man-trap area for secured access into the modular data center facility, a loading dock, and a fishbowl security center that looks over the both the lobby man-trap area and the loading dock (See FIG. 2B). The fishbowl security center also overlooks a portion of a parking lot for the modular data center facility simultaneously with the lobby mantrap area and loading dock to reduce costs. Access control badges and entry processing will be performed at the site by security in the fishbowl security center.

The office-support building module 302 has the aligned doors fabricated into the building module in order to interconnect with the connecting corridor, which forms an outer layer of another building module that is adjacent and abutted to the office-support building module 302. The office-support building module 302 serves as the support center for datacenter operations. The office-support building module 302 has all the necessary spaces to run datacenter operations. This module comprises of the loading dock, lobby, security center, restrooms, secondary POP room, and office space. The security center is designed using a Fishbowl Security concept to maximize the efficiency of the security officers and provide loading dock vigilance while still staffing the main security center. The loading dock area consists of a single dock leveler and overhead door. The loading dock has a canopy for weather and is designed to take a semi-tractor trailer. Additionally, there is a bay for a cardboard compactor. The loading dock is designed to take the equipment on or off the truck as well as de-box. From the loading dock, the equipment can be moved directly into the storage room of the hardened-structure building module 306 or use the hardened-structure building module 306 service corridor to move to the storage of an expansion hardened-structure building module 306. The office space contemplates an open floor plan. Entrance to the office is secure and badge access only.

Figure 4:
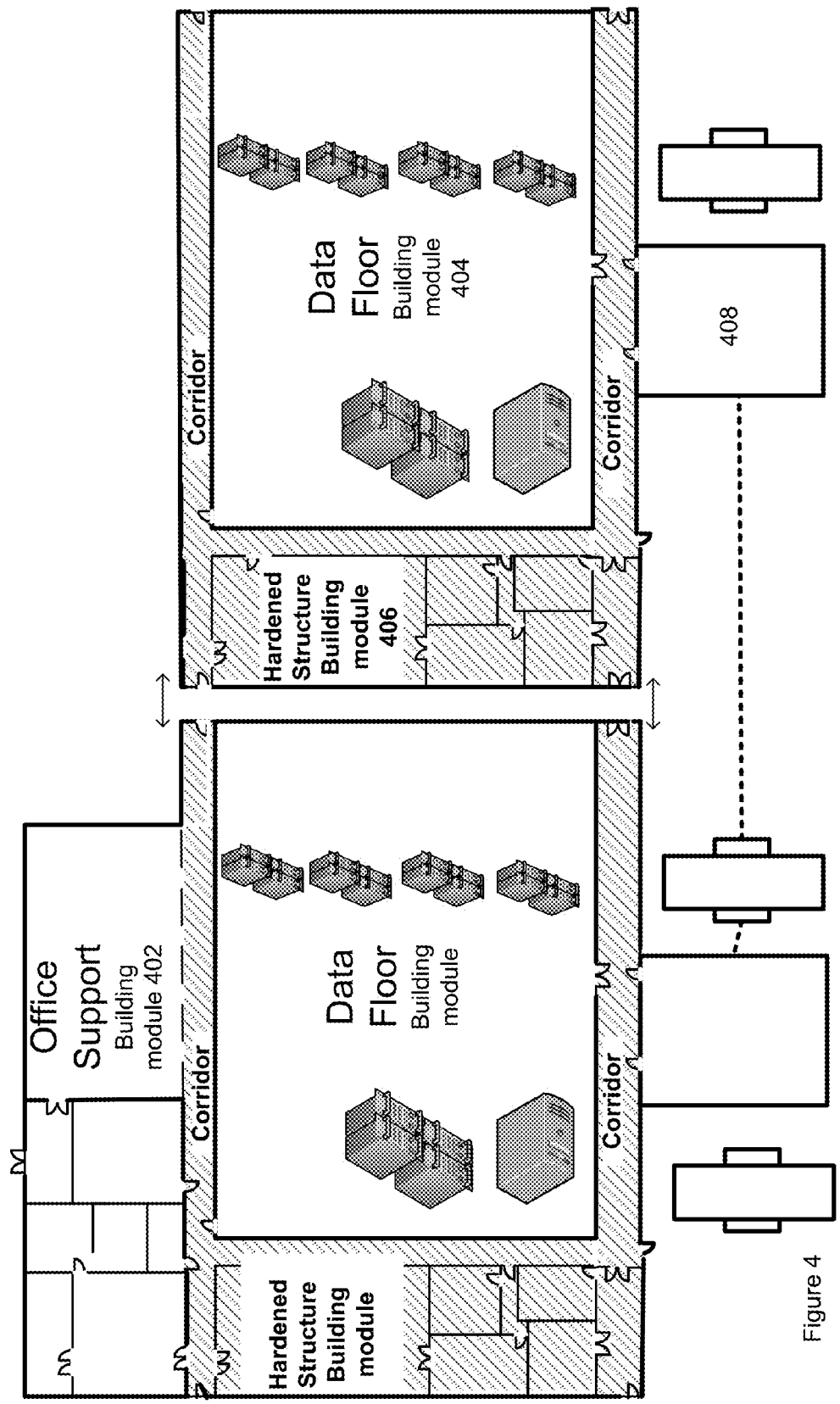

FIG. 4 illustrates a block diagram of an embodiment of a physical composition and geographic arrangement of building modules matched to a current capacity and space needs of a user of the modular datacenter facility as well as to a geography of the parcel of land that the modular data center facility will be located on.

An example one Megawatt datacenter facility with all four building modules is expanded to a two Megawatt facility with the addition of another data-floor building module 404, hardened-structure building module 406, and power-center building module 408. The power-center building module 408 has one generator and the swing generator of the first instance of the power-center building module is electrically coupled to supply backup power to either set of building modules.

The building connecting methodology via a connecting corridor makes datacenter expansion simple. Each step of expansion consisting of adding a hardened-structure building module 406, a data-floor building module 404, a power center building module 408 and optionally an office-support building module 402 is built adjacent an existing one with connections via the service corridor and the personnel corridor. Conduits may be run diversely down the service and personnel corridors for network connectivity. A major advantage of this model is you are never constructing in the same building footprint as your original datacenter. A one Megawatt modular datacenter facility site can expand to, for example, a four-megawatt modular datacenter facility by adding three additional sets of building modules. The number of sets of building modules making up the modular datacenter depends on the size of the parcel of land (more land=more datacenters).

Both a physical composition and geographic arrangement of a first configuration of building modules in the initial set can be different than a second configuration of building modules in the initial set; and thus, the set of building modules can be matched to a current capacity and space needs of a user of the modular datacenter facility as well as to a geography of the parcel of land that the modular data center facility will be located on. Each expansion set of building modules is built adjacent an existing one with connections via the service corridor and the personnel corridor.

The aligned doors for the connecting corridors may be walled off/sealed off to become part of a permanent wall when the interconnection point is desired removed for security or other purposes. The aligned doors swing in an opposite direction of the building module they are connecting too in order to allow easier access between the distinctly different building modules abutted together, which are also then interconnected, via a flange, a link, or other interconnection mechanism, to each other to form a single modular datacenter facility. Each building type includes the interconnection mechanism to optional component additions of additional building modules. The aligned doors connecting to another building module typically also have key card access readers installed to control operation of that doors locking mechanism.

In an embodiment, at least one of 1) electrical fiber conduits and 2) network fiber conduits are run diversely down the connecting corridors for network connectivity between adjacent building modules to facilitate interconnecting two building modules adjacent and abutted to each other. Alternatively, the modular datacenter facility may use the outside plant conduit infrastructure for electrical or network connectivity.

In instances where multiple customers use the data center facility, while the building modules abut each other, neither building module may have access to the other building module, as the connecting corridors would be walled off. However, if it is merely the same client expanding, then the connecting fiber conduits and service corridors makes the two constructed building modules one larger extended module.

Figure 5:
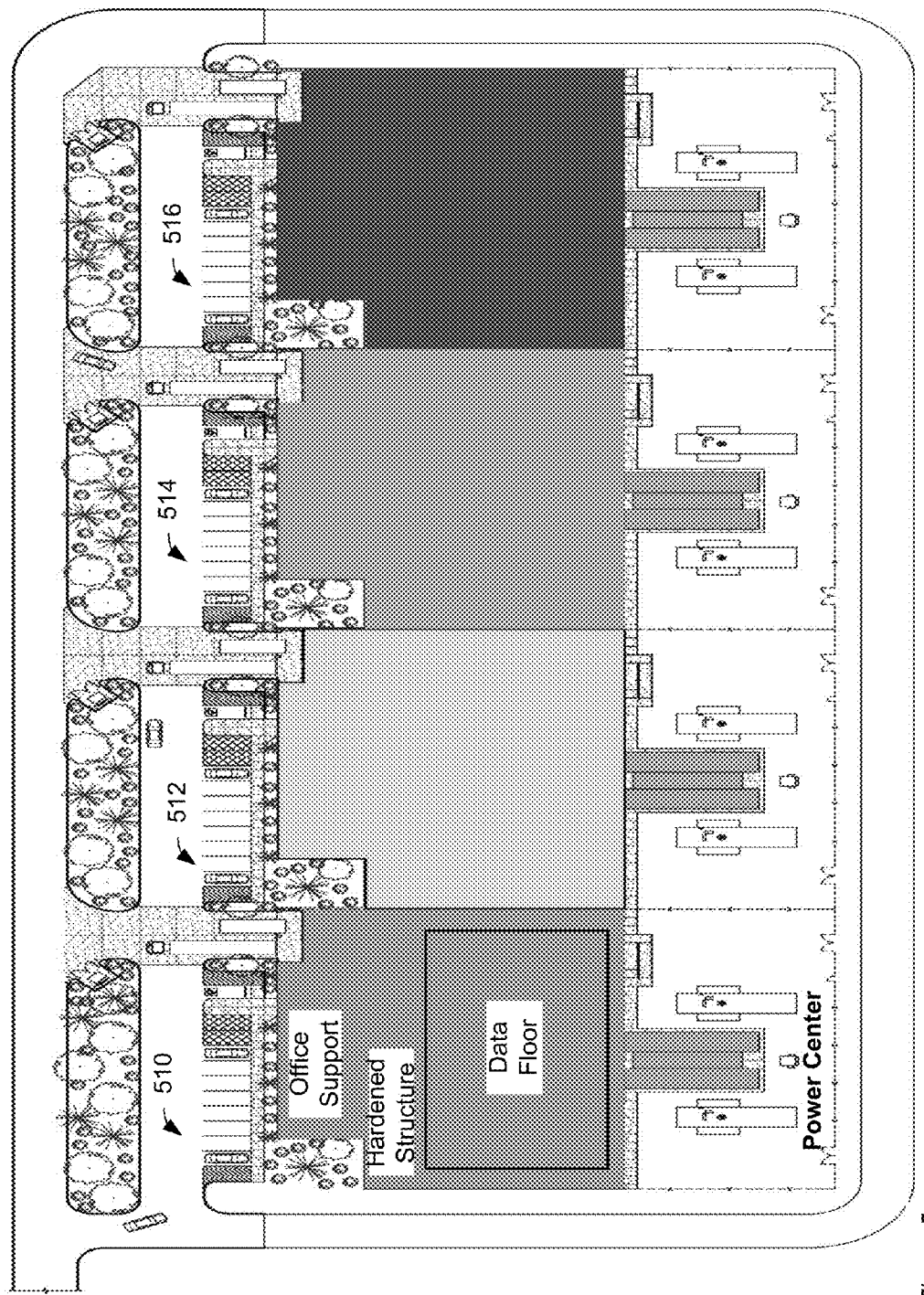
FIG. 5 illustrates a block diagram of an embodiment of an expansion of an initial set of building modules built upon a parcel of land, and then at a future point in time, additional building modules of the different types are added to the initial set of building modules over time.

FIG. 5 illustrates a block diagram of an embodiment of an expansion of an initial set of building modules built upon a parcel of land, and then at a future point in time, additional building modules of the different types are added to the initial set of building modules over time. The initial set of building modules 510 built upon a parcel of land contained one building module of each type. Over time, three additional sets of building modules 512-516 are added to that parcel of land. Each set of building modules 512-516 can be connected to form a larger data center for a given user of the datacenter as shown in FIG. 4 or be isolated for each set of building modules 512-516 being its own datacenter facility to used by different user and simply be shared on the same plot of land. FIG. 5 depicts a four Megawatt conceptual site plan. In this example, each client has their own office-support building module and no sharing of any kind exist between the different sets of building modules. Thus, four distinct one Megawatt datacenter facilities 510-516 each with their own office-support building module and power center building module.

Each set of building modules 510-516 has its own dedicated mechanical and electrical systems in this data center facility (i.e. No shared equipment between different customer's building modules). Thus, in contrast to data centers with shared backplanes for generators and mechanical or that are daisy chained together, as with containers, each set of building modules that has its own dedicated mechanical and electrical systems in this data center facility are not subject to the "Christmas light bulb" phenomenon since the failure of one power center or data hall does not increase the risk of bringing down all the others.

Figure 6:
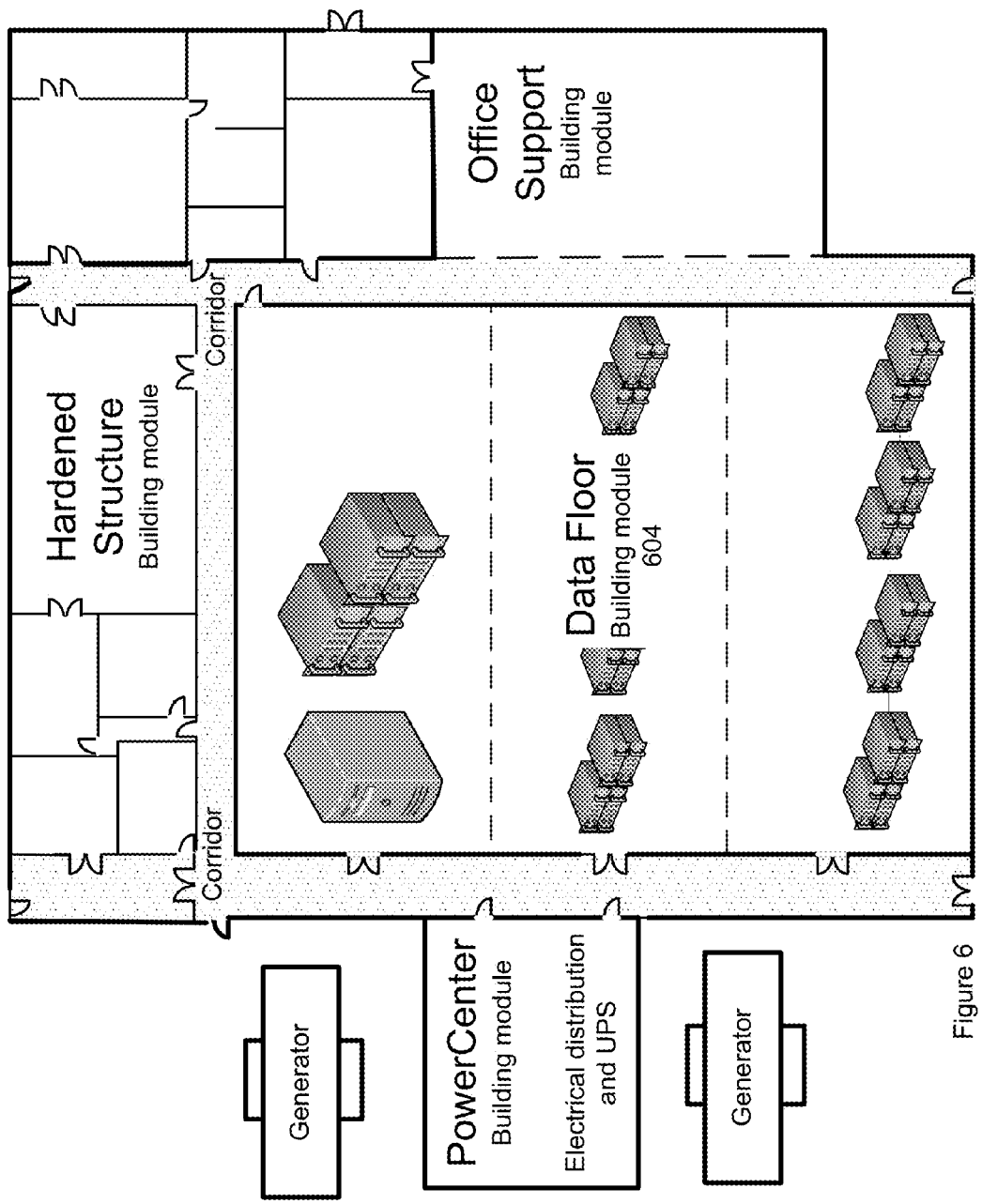
FIG. 6 illustrates a block diagram of an embodiment of the data-floor building module with partitioned floor space into private suites for portions of the computing systems via erection of non-weight bearing walls from floor to ceiling to separate each private suite within the single data-floor building module.
Figure 7:
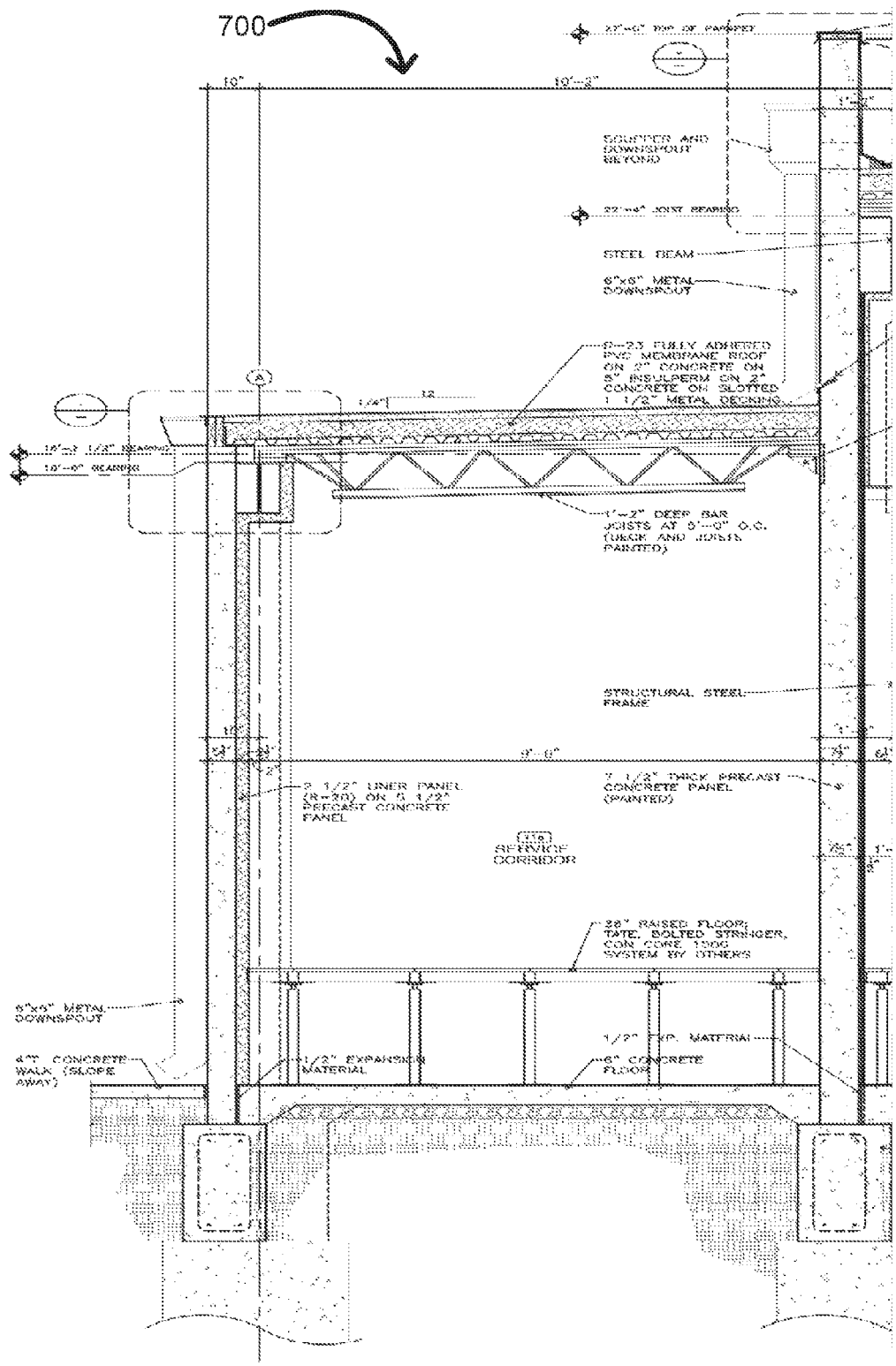
FIG. 7 illustrates a diagram of an embodiment of a modular datacenter facility or a portion thereof 700.

FIG. 6 illustrates a block diagram of an embodiment of the data-floor building module with partitioned floor space into private suites for portions of the computing systems via erection of non-weight bearing walls from floor to ceiling to separate each private suite within the single data-floor building module.

Another flexible design option included with the data-floor building module 604 is the ability to compartmentalize the data-floor building module 604 in dedicated suites for your customers/users. This allows for walled separation between clients in addition to just cages to create dedicated datacenter suites within the data-floor building module 604.

The data-floor building module 604 is pre-architected with the ability to easily partition a floor space within a single data-floor building module 604 into private suites for portions of the computing systems via erection of non-weight bearing walls from floor to ceiling to separate each private suite within the single data-floor building module 604. Each private suite is aligned to a wall section forming the shell of the data-floor building module 604 that is tied to a foundation/hardened environment, where that wall section has a doorway entrance into a raised floor space housing the portion of the computing systems in that private suite section.

Thus, with this expansion model, a customer/user never significantly overpays for huge amounts of unused shell space or datacenter capacity. The model takes a parcel of land (8-15 acres in size) and builds modularly on that land. Ideally, the land is parcel into separate lots, allowing each datacenter building to be on its own parcel. Expansion using a this connection methodology allows clients to expand incrementally. Unlike other offerings in the marketplace, the method matches the building with the datacenter. When a client is ready to expand on the existing truly modular building datacenter facility, the design and engineering of the existing building modules allows for the model to build additional modular building types and connect them to the existing facility via the service corridor and the personnel corridor. This results in eliminating construction chaos because the expansion is a totally separate building but then easily connected to and integrated with that separate building. The only connecting components may be the fiber conduits and the service corridors. Additionally, the modular datacenter facility has an office support-building module designed to interconnect with the other building modules. The support spaces (such as office, loading dock, lobby, etc.) have not been a modular addition until now. This means that a customer/user can choose whether or not to share the office-support building module. If there are two adjacent clients, each can choose to have their own dedicated office-support building module. While the building abut each other, neither client has access to the other client, as the connecting corridors would be walled off. However, if it is merely the same client expanding, then the connecting fiber conduits and service corridors makes the two constructed building modules one larger extended module. The client has the ability to build modular with not only the datacenter infrastructure, but the supporting building as well.

The truly modular building datacenter facility is implemented on raw land sites in major metro areas. Once parcel of land is a developed pad site, then one can build the truly modular datacenter facility. The move-in ready truly modular building datacenter facility provides the local market with immediate availability (as they currently may have with retail colocation providers), but with a wholesale truly modular building datacenter facility offering that allows them complete control and dedicated infrastructure (as opposed to shared). The truly modular building datacenter concepts include at least a wholesale datacenter design, architecture, and construction.

The modular power-centers provide all the benefits of the off-site fabrication while being fully integrated into the building. This approach means that the most complicated and advanced construction takes place in a factory, while the common trades take place on site.

The truly modular building datacenter facility connects new buildings to existing building in a way to manage growth effectively. With the readily accepted assumption that "cost efficiency comes from scale", the typical thinking is that you cannot justify a high-cost small building solution. However, the truly modular building datacenter facility design and construction using building modules with the same design and construction allows a competitively priced product on small, dedicated building basis.

Referring to FIG. 4, the truly modular datacenter's modular construction allows for multiple datacenters to be built contiguous (or not, based on customer's preference) by using the connection corridors joined together to form a bridge between the two or more modular datacenters.

If there is an existing datacenter facility occupied by a customer and a new customer opportunity exist, then the first step is to determine if the new customer accepts sharing the office-support building module 402 with another customer. If the new customer does not want to share the office-support building module 402, this new set of building modules will include one. If the new customer does want to share the office-support building module 402, then the existing data-floor building module may be partitioned in dedicated suites or a new set of building modules will be added that include the data-floor building module 404, harden-shell building module, and a power-center building module 408.

The modular data center design style has components of the data center prefabricated and standardized so that they can be constructed, moved or added to quickly as needs change.

While some specific embodiments of the invention have been shown, the invention is not to be limited to these embodiments. The invention is to be understood as not limited by the specific embodiments described herein, but only by scope of the appended claims.

The invention claimed is:

1. An apparatus, comprising:
a modular datacenter facility constructed with a set of building modules of different types of functionality to form an entire datacenter facility, where each type of building module in the set has a specific collection of functionality associated with that type of building module, where each building module of the different types is a pre-engineered, standardized building block having a standardized pre-approved architectural design and layout, where a first type of building module in the modular datacenter facility is a data-floor building module that is pre-engineered and has the pre-approved architectural design and layout to house computing systems, where the computing systems include servers and storage devices that are housed in hot and cool zones, and routers and switches that transport data traffic between the servers as well as transport traffic to a world exterior to the modular datacenter facility, where each wall section of a building module forming a hardened shell of the datacenter facility has a reinforced framework at least five and a half inches thick, where each wall section is pre-fabricated to interconnect and secure in place with another wall section, where each roof section has a reinforced framework and is tied to the wall sections, where the wall sections forming the hardened shell are tied to a foundation.

2. The apparatus of claim 1, where each of the wall sections forming the hardened shell of the datacenter facility has a shelf angle to receive joists, where the joists are formed of exposed steel in order to support a weight of a roof and the wall sections of the hardened shell and transfer that weight through the reinforced framework built into the sectioned walls onto the foundation of the datacenter facility.

3. The apparatus of claim 1, where each of the wall sections forming the hardened shell is at least eight inches thick, where each wall section forming the hardened shell interconnects and secures in place with adjacent wall sections with a tongue and groove mechanism, and each wall section forming the shell is prefabricated and shipped to a parcel of land to be installed as part of a hardened-structure building module, where every wall section forming the shell of the data-floor building module is designed and architected to tie to the foundation.

4. The apparatus of claim 1, where the wall sections of the hardened shell include a steel moment-connected reinforced-frame structure with columns and beams, where the wall sections are connected with steel-based joists, where a second type of building module is a hardened-structure building module that is pre-engineered and has the pre-approved architectural design as a separate building from the data-floor building module and is built with the hardened shell to surround the data-floor building module.

5. The apparatus of claim 4, where the wall sections connect to the foundation, where the foundation is architected to be a 12-inch wide continuous cast-in-place wall supported by variable width continuous footings for the data-floor building module and for the hardened-structure building module to withstand at least a 1.5 seismic importance factor, wherein a slab of the building modules is architected to be a 5-inch slab for the data-floor building module and a 4-inch slab for the other building modules, and where a third type of building module in the set of building modules is engineered and architected to be a power-center building module that includes a pre-engineered electrical system including switchgear, an Uninterruptable Power Supply, and power controls, where the power-center building module has a steel shell structure around the power-center building module.

6. The apparatus of claim 1, where an exterior wall of the hardened shell is formed of concrete panels 5 to 12 inches thick, which provide for at least 3-hour fire separation satisfying International Building Code (IBC) firewall requirements, and which are wrapped around the data-floor building module.

7. The apparatus of claim 1, where the data-floor building module has a column-free floor space containing the computing systems that supports racks of the servers varying in power consumption densities without containment walls between the racks of the servers of varying power consumption densities up to a high density rack of 30 kilowatts, where the data-floor building module has a steel-based joist, including steel and steel-reinforced concrete beams, horizontally connecting two parallel sections of wall of the building module to eliminate a need for support columns being located on a raised floor that supports the computing systems in order to ensure that users of the data-floor building module will have a maximum degree of flexibility to accommodate a variety of potential server rack configurations for the racks of servers of varying power consumption densities in the hot and cold zones of the data-floor building module, where the raised floor houses the computing systems as well as creates two plenums for air supply with cooling supply air being supplied underneath the raised floor as well as a ceiling plenum for hot air return.

8. The apparatus of claim 1, where the data-floor building module contains the computing systems, where the data-floor building module has segmented walls interlocked with an adjacent wall segment that are also horizontally connected by joists to create an open floor space and eliminate any need for support columns on a raised floor that supports racks of servers of varying power consumption densities in the computing systems, where the raised floor exceeds 2500 square feet, which id 1) a larger area upon which to store computing equipment than any area in a standard shipping container and also 2) enough square feet to support the varying power consumption densities in two or more server rack configurations.

9. The apparatus of claim 1, where each wall section of a building module forming the hardened shell of the datacenter facility has the reinforced framework with concrete panels of at least 10 inches thick to meet standards of an IBC category IV structure to withstand up to 150 mph winds and a 1.5 seismic importance factor, where the wall sections forming the hardened shell are connected to the foundation with a below-grade 12-inch wide continuous cast-in-place wall supported by variable width continuous footings.

10. The apparatus of claim 9, wherein a second building module type of the set of building modules is a hardened-structure building module that has the hardened shell of the datacenter facility, and has one or more personnel or service corridors between a first instance of the hardened-structure building module that connects to an abutted second instance of the hardened-structure building module, where the one or more personnel or service corridors are laid out between an interior wall of the hardened-structure building module and an exterior wall forming the hardened shell of the hardened-structure building module.

11. A method for constructing a modular datacenter facility with a standardized set of building modules of different types of functionality, comprising:
constructing the modular datacenter facility with the set of building modules of different types of functionality to form an entire datacenter facility, where each type of building module in the set has a specific collection of functionality associated with that type of building module, where each building module of the different types is a pre-engineered, standardized building block having a standardized pre-approved architectural design and layout, where a first type of building module in the modular datacenter facility is a data-floor building module that is pre-engineered and has the pre-approved architectural design and layout to house computing systems; and
constructing each wall section to interconnect and secure in place with another wall section, where the wall sections of a building module forming a hardened shell are connected to a foundation, where the computing systems include servers and storage devices that are housed in hot and cool zones, and routers and switches that transport data traffic between the servers as well as transport traffic to a world exterior to the modular datacenter facility in the data-floor building module, where each wall section forming the hardened shell of the datacenter facility has a reinforced framework at least 5½ inches thick.

12. The method of claim 11, further comprising:
constructing each of the wall sections forming the hardened shell of the datacenter facility to have cast-in-place weld plates for a shelf angle to receive joists; and
forming the joists of exposed steel in order to support a weight of a roof and the wall sections of the hardened shell and transfer that weight through the reinforced framework built into the sectioned walls onto the foundation of the datacenter facility.

13. The method of claim 11, further comprising:
constructing each of the wall sections forming the hardened shell to be at least ten inches thick; and
constructing each wall section forming the hardened shell to interconnect and secure in place with adjacent wall sections with a tongue and groove mechanism, where each wall section forming the hardened shell is prefabricated and shipped to a parcel of land to be installed as part of a hardened-structure building module, where every wall section forming the shell of the data-floor building module is designed and architected to tie to the foundation.

14. The method of claim 11, further comprising:
constructing the wall sections of the hardened shell to include a steel-moment connected reinforced-frame structure with columns and beams; and
constructing where the wall sections to be connected with steel-based joists, where a second type of building module is a hardened-structure building module that is pre-engineered and has the pre-approved architectural design as a separate building from the data-floor building module and is built with the hardened shell to surround the data-floor building module.

15. The method of claim 14, further comprising:
constructing the wall sections to connect to the foundation, where the foundation is engineered and architected to be a below-grade 12-inch wide continuous cast-in-place wall supported by variable width continuous footings for the data-floor building module, and for the hardened-structure building module to withstand at least a 1.5 seismic importance factor, wherein a slab of the building modules is architected to be a 5-inch slab for the data-floor building module and a 4-inch slab for the other building modules, and where a third type of building module in the set of building modules is engineered and architected to be a power-center building module that includes a pre-engineered electrical system including switchgear, an Uninterruptable Power Supply, and power controls, where the power-center building module has a hardened steel shell structure around the power-center building module.

16. The method of claim 11, where an exterior wall of the hardened shell is formed of concrete panels 5 to 12 inches thick, which provide for at least 3-hour fire separation satisfying IBC firewall requirements, and which are wrapped around the data-floor building module.

17. The method of claim 11, further comprising:
constructing the data-floor building module to have a column-free floor space that contains the computing systems that supports racks of the servers varying in power consumption densities without containment walls between the racks of the servers of varying power consumption densities; and
constructing the data-floor building module to have a steel-based joist that horizontally connects two parallel wall sections of the building module to eliminate a need for support columns being located on a raised floor that supports the computing systems, where the use of the steel-based joist or a concrete beam to eliminate columns ensures that users of the data-floor building module will have a maximum degree of flexibility to accommodate a variety of potential server rack configurations for the racks of servers of varying power consumption densities in the hot and cold zones of the data-floor building module, where the raised floor houses the computing systems as well as creates two plenums for air supply with cooling supply air being supplied underneath the raised floor as well as a ceiling plenum for hot air return.

18. The method of claim 11, further comprising:
constructing the data-floor building module that contains the computing systems, where the data-floor building module has segmented walls interlocked with an adjacent wall segment that are also horizontally connected by joists to create an open floor space and eliminate any need for support columns on a raised floor that supports racks of servers of varying power consumption densities in the computing systems, where the raised floor exceeds 2500 square feet, which is 1) a larger area upon which to store computing equipment than any area in a standard shipping container and also 2) enough square feet to support varying power consumption densities in two or more server rack configurations.

19. The method of claim 11, where each wall section forming the hardened shell of the datacenter facility has the reinforced framework with concrete panels of at least 10 inches thick to meet standards of an IBC category IV structure to withstand up to 150 mph winds and a 1.5 seismic importance factor, where the wall sections forming the hardened shell are connected to the foundation with at least a 12-inch wide continuous cast-in-place wall supported by variable width continuous footings.

20. The method of claim 19, wherein a second building module type of the set of building modules is a hardened-structure building module that has the hardened shell of the datacenter facility, and has one or more personnel or service corridors between a first instance of the hardened-structure building module that connects to an abutted second instance of the hardened-structure building module, where the one or more personnel or service corridors are laid out between an interior wall of the hardened-structure building module and an exterior wall forming the hardened shell of the hardened-structure building module.

21. The method of claim 11, wherein the modular datacenter facility with the standardized set of building modules of different types of functionality is the modular datacenter facility of claim 1.

* * * * *